(12) United States Patent
Yamada (10) Patent No.: US 9,412,454 B2
(45) Date of Patent: Aug. 9, 2016

(54) SEMICONDUCTOR MEMORY DEVICE AND METHOD FOR DRIVING THE SAME

(71) Applicant: Kabushiki Kaisha Toshiba, Minato-ku (JP)

(72) Inventor: Kunihiro Yamada, Suzuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/809,803

(22) Filed: Jul. 27, 2015

(65) Prior Publication Data

US 2016/0078943 A1    Mar. 17, 2016

(30) Foreign Application Priority Data

Sep. 16, 2014   (JP) ................... 2014-188021

(51) Int. Cl.

| G11C 16/04 | (2006.01) |
|---|---|
| G11C 16/08 | (2006.01) |
| G11C 16/24 | (2006.01) |
| H01L 27/115 | (2006.01) |
| G11C 16/16 | (2006.01) |
| G11C 16/14 | (2006.01) |

(52) U.S. Cl.
CPC ............ *G11C 16/08* (2013.01); *G11C 16/0483* (2013.01); *G11C 16/24* (2013.01); *H01L 27/11556* (2013.01); *H01L 27/11582* (2013.01); *G11C 16/14* (2013.01); *G11C 16/16* (2013.01)

(58) Field of Classification Search
CPC ........ G11C 16/10; G11C 16/08; G11C 16/14; G11C 16/16; G11C 8/08; G06F 12/0246
USPC ................... 365/185.23, 185.18, 185.29
See application file for complete search history.

(56) References Cited

U.S. PATENT DOCUMENTS

| 6,483,752 | B2 | 11/2002 | Hirano |
| 7,936,004 | B2 | 5/2011 | Kito et al. |
| 8,189,371 | B2 | 5/2012 | Katsumata et al. |
| 8,194,467 | B2 | 6/2012 | Mikajiri et al. |
| 8,372,720 | B2 | 2/2013 | Fukuzumi et al. |
| 8,400,842 | B2 * | 3/2013 | Kito .............. G11C 16/04 365/185.24 |
| 8,551,838 | B2 | 10/2013 | Kito et al. |
| 8,729,624 | B2 | 5/2014 | Fukuzumi et al. |
| 8,767,466 | B2 | 7/2014 | Asaoka et al. |
| 9,035,374 | B2 | 5/2015 | Fukuzumi et al. |
| 9,064,735 | B2 | 6/2015 | Kito et al. |
| 2007/0252201 | A1 | 11/2007 | Kito et al. |
| 2010/0207195 | A1 | 8/2010 | Fukuzumi et al. |

(Continued)

*Primary Examiner* — David Lam
(74) *Attorney, Agent, or Firm* — Oblon, McClelland, Maier & Neustadt, L.L.P.

(57) ABSTRACT

According to one embodiment, a semiconductor memory device includes: semiconductor member; electrode member; charge accumulation member; a memory unit; and a control unit. Memory cell is formed at each crossing portion of the semiconductor member and the electrode member. The memory unit retains information indicating that the memory cell belongs to first group or second group. The control unit performs first step and second step, when reducing the charge accumulated in the charge accumulation member. In the first step, first voltage is applied both between the semiconductor member and the electrode member of the first group and between the semiconductor member and the electrode member of the second group. In the second step, second voltage is applied between the semiconductor member and the electrode member constituting the memory cell belonging to the second group.

14 Claims, 11 Drawing Sheets

(56) References Cited

U.S. PATENT DOCUMENTS

| | | |
|---|---|---|
| 2011/0284947 A1 | 11/2011 | Kito et al. |
| 2011/0287597 A1 | 11/2011 | Kito et al. |
| 2013/0126961 A1 | 5/2013 | Fukuzumi et al. |
| 2014/0217493 A1 | 8/2014 | Fukuzumi et al. |
| 2015/0200204 A1 | 7/2015 | Fukuzumi et al. |

* cited by examiner

APPLY ERASE VOLTAGE TO ONLY HARD-TO-ERASE MEMORY CELLS

APPLY ERASE VOLTAGE TO ALL MEMORY CELLS

SEMICONDUCTOR MEMORY DEVICE AND METHOD FOR DRIVING THE SAME

CROSS-REFERENCE TO RELATED APPLICATIONS

This application is based upon and claims the benefit of priority from Japanese Patent Application No.2014-188021, filed on Sep. 16, 2014; the entire contents of which are incorporated herein by reference.

FIELD

Embodiments described herein relate generally to a semiconductor device and a method for driving the same.

BACKGROUND

A conventional nonvolatile semiconductor memory device of the NAND type includes numerous memory cells integrated in two dimensions on a silicon substrate. However, processing has been made difficult with the miniaturization of memory cells. Further advancement of memory cell miniaturization needs introduction of new technologies such as EUV (extreme ultraviolet) exposure. However, this causes a problem in terms of cost.

One proposed solution to this problem is a method for manufacturing a three-dimensional multilayer memory device by collective processing. This method can collectively form memory cells irrespective of the number of stacked layers. Thus, cost increase can be suppressed.

DETAILED DESCRIPTION

According to one embodiment, a semiconductor memory device includes: a plurality of semiconductor members; a plurality of electrode members; a charge accumulation member capable of accumulating charge; a memory unit; and a control unit. The plurality of semiconductor members are arranged along a first direction and a second direction, the second direction crossing the first direction, and the plurality of semiconductor members extend in a third direction crossing a plane including the first direction and the second direction. The plurality of electrode members extend in a direction crossing the third direction. The charge accumulation member is provided between the semiconductor member and the electrode member, and the charge accumulation member is capable of accumulating charge. The memory unit is configured to retain information, the information indicates a memory cell belongs to a first group or a second group, the memory cell is formed at each crossing portion of the semiconductor member and the electrode member via the charge accumulation member. The control unit is configured to perform a first step and a second step when reducing the charge accumulated in the charge accumulation member. In the first step, a first voltage is applied both between the semiconductor member and the electrode member constituting the memory cell belonging to the first group and between the semiconductor member and the electrode member constituting the memory cell belonging to the second group, the first voltage is such that potential of the electrode member is lower than potential of the semiconductor member. In the second step, a second voltage is applied between the semiconductor member and the electrode member constituting the memory cell belonging to the second group, the second voltage is such that potential of the electrode member is lower than potential of the semiconductor member.

First Embodiment

First, a first embodiment is described.

The semiconductor memory device according to the embodiment is a multilayer nonvolatile semiconductor memory device.

Figure 1:
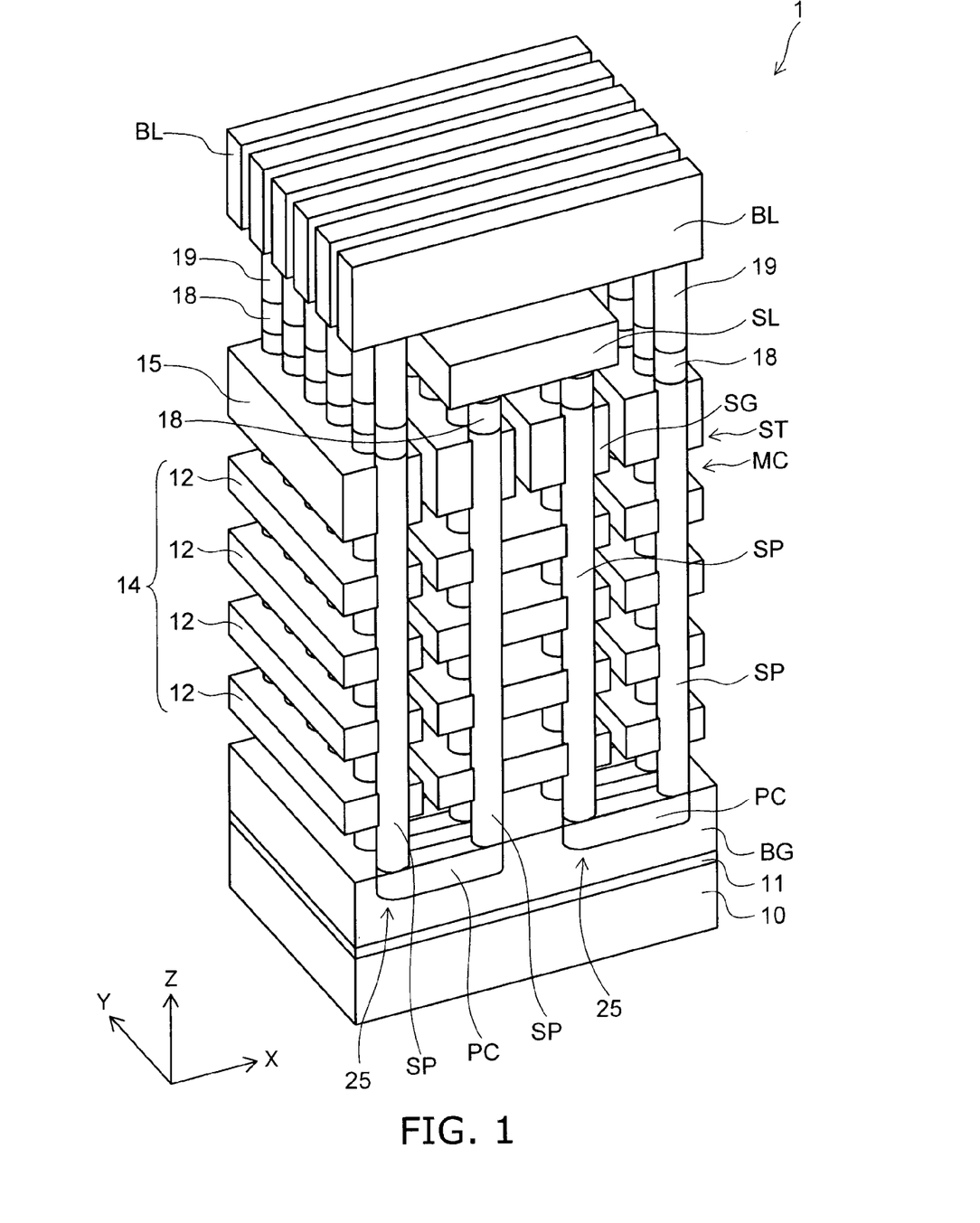
FIG. 1 is a perspective view showing a semiconductor memory device according to a first embodiment.

FIG. 1 is a perspective view showing a semiconductor memory device according to the embodiment.

Figure 2:
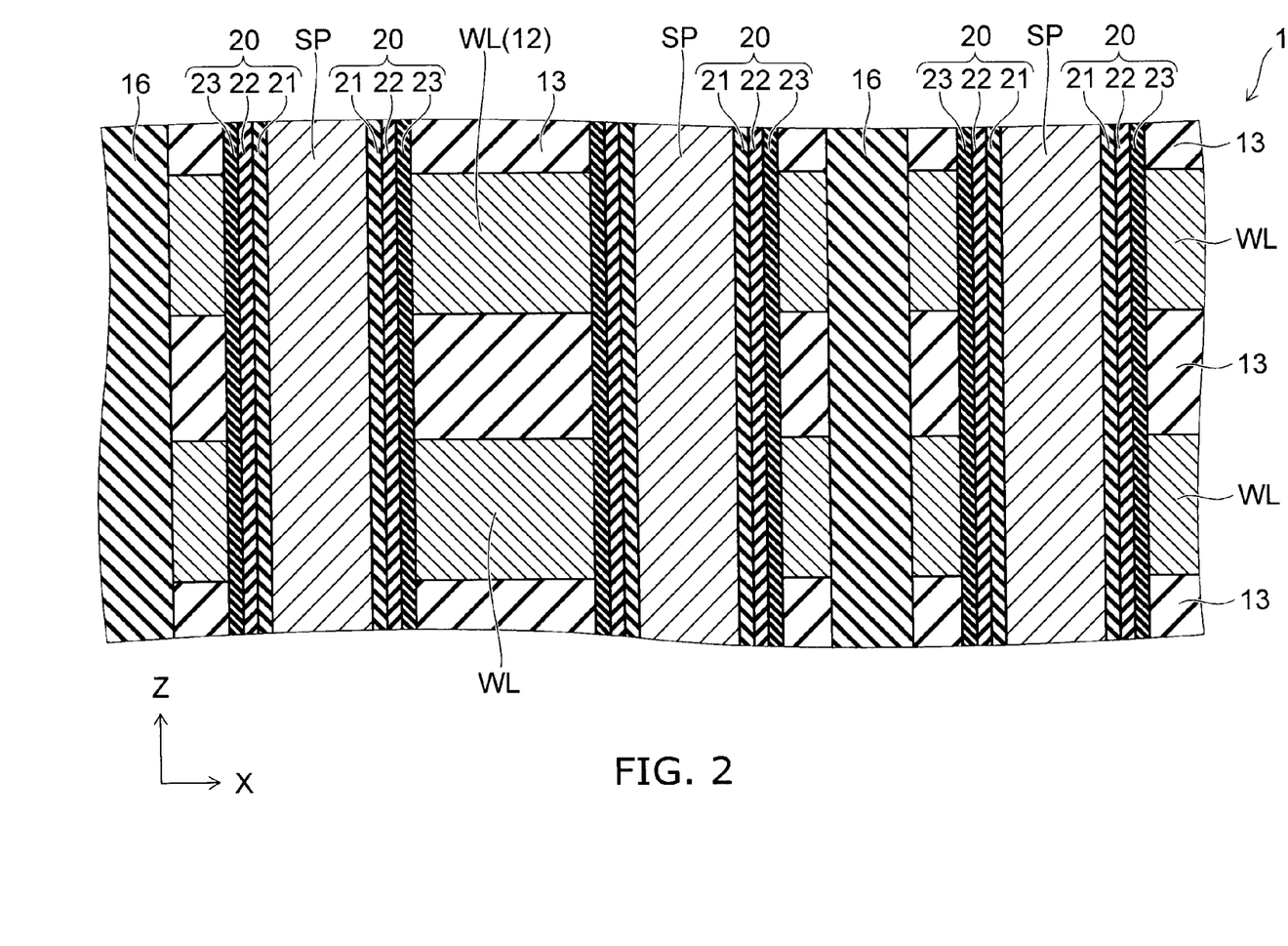
FIG. 2 is a sectional view showing the semiconductor memory device according to the first embodiment.

FIG. 2 is a sectional view showing the semiconductor memory device according to the embodiment.

Figure 3:
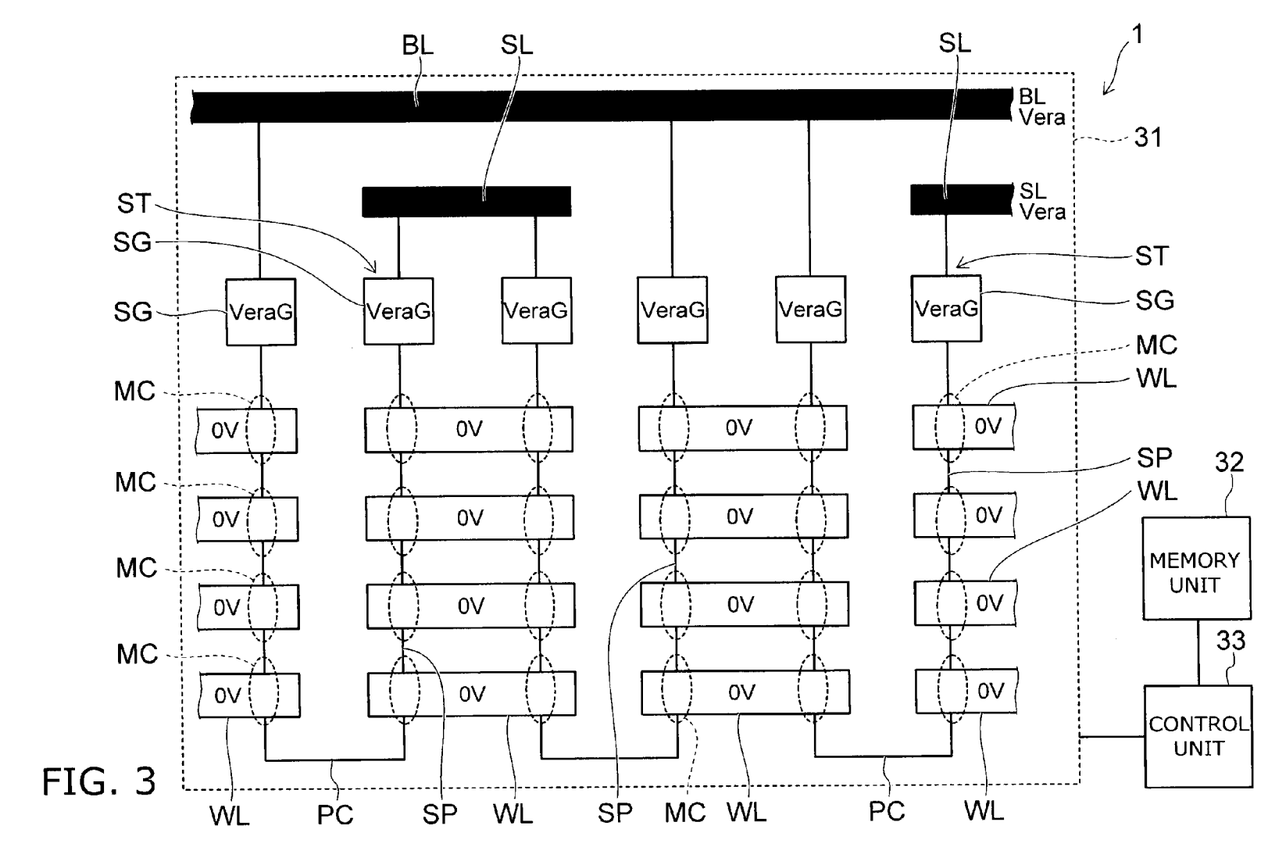
FIG. 3 is a circuit diagram schematically showing the semiconductor memory device according to the first embodiment.

FIG. 3 is a circuit diagram schematically showing the semiconductor memory device according to the embodiment.

For convenience of illustration, FIG. 1 primarily shows conductive members, and omits some insulating members. FIG. 2 shows the neighborhood of silicon pillars and word lines in an enlarged view.

As shown in FIG. 1, the semiconductor memory device 1 according to the embodiment includes a silicon substrate 10.

In the following, for convenience of description, an XYZ orthogonal coordinate system is adopted in this specification. Two directions parallel to the upper surface of the silicon substrate 10 and orthogonal to each other are referred to as "X-direction" and "Y-direction". The direction perpendicular to the upper surface of the silicon substrate 10, i.e., the vertical direction, is referred to as "Z-direction".

An insulating film 11 and a back gate electrode BG are provided on the silicon substrate 10. The back gate electrode BG is shaped like a flat plate and partitioned into blocks 31 (see FIG. 3) described later. A pipe connector PC is provided in the back gate electrode BG. The longitudinal direction of the pipe connector PC is directed in the X-direction. The pipe connector PC is shaped like a generally rectangular solid. A plurality of electrode films 12 are stacked via interlayer insulating films 13 (see FIG. 2) on the back gate electrode BG and constitute a multilayer body 14. The electrode film 12 is divided into strip-shaped portions extending in the Y-direction. Each strip-shaped portion constitutes a word electrode WL. That is, in the multilayer body 14, a plurality of word electrodes WL each extend in the Y-direction, and are arranged along the X-direction and the Z-direction with spacing from each other.

An electrode film 15 is provided on the multilayer body 14. The electrode film 15 is divided into strip-shaped portions extending in the Y-direction. Each strip-shaped portion constitutes a select gate electrode SG. Two select gate electrodes SG are provided directly above one word electrode WL. Each of the back gate electrode BG, the pipe connector PC, the word electrode WL, and the select gate electrode SG is a conductive film formed from silicon (Si) containing impurity such as boron (B). A source line SL made of e.g. metal and extending in the Y-direction is provided on the select gate electrode SG. A bit line BL made of e.g. metal and extending in the X-direction is provided on the source line SL.

A plurality of silicon pillars SP are provided through the multilayer body 14 and the select gate electrode SG. The silicon pillars SP are arranged in a matrix along the X-direction and the Y-direction. Each silicon pillar SP extends in the Z-direction. Two silicon pillars SP adjacent in the X-direction are connected to each other through the pipe connector PC. Of the two silicon pillars SP connected to each other through the pipe connector PC, one silicon pillar SP is connected to the source line SL through a plug 18, and the other silicon pillar SP is connected to the bit line BL through a plug 18 and a plug 19.

Each word electrode WL is penetrated by two silicon pillars SP being adjacent in the X-direction and connected to different pipe connectors PC. Two silicon pillars SP connected to each other through a pipe connector PC penetrate through different word electrodes WL. An insulating member 16 spread in the YZ-plane is provided between the word electrodes WL adjacent in the X-direction and between the interlayer insulating films 13.

As shown in FIG. 2, a memory film 20 is provided on the outer surface of a structure composed of the silicon pillars SP and the pipe connector PC. In the memory film 20, a tunnel insulating film 21, a charge accumulation film 22, and a block insulating film 23 are stacked sequentially from the silicon pillar SP side. The tunnel insulating film 21 is a film that is normally insulating. However, the tunnel insulating film 21 passes an FN tunnel current under application of a prescribed voltage within the range of the driving voltage of the semiconductor memory device 1. The charge accumulation film 22 is a film capable of accumulating charge. The charge accumulation film 22 is formed from e.g. a material including electron trap sites. The block insulating film 23 is a film passing substantially no current even under application of voltage within the range of the driving voltage of the semiconductor memory device 1.

Thus, a memory cell MC is formed in the crossing portion of the silicon pillar SP and the word electrode WL via the memory film 20. A select transistor ST is formed in the crossing portion of the select gate electrode SG and the silicon pillar SP via the memory film 20. Here, instead of the memory film 20, a gate oxide film may be provided between the select gate electrode SG and the silicon pillar SP.

By the foregoing configuration, as shown in FIG. 3, a select transistor ST, a plurality of memory cells MC, a pipe connector PC, a plurality of memory cells MC, and a select transistor ST are connected in series between the bit line BL and the source line SL to constitute a NAND string 25. In the block 31, a plurality of NAND strings 25 are arranged in a matrix along the X-direction and the Y-direction. In the block 31, the NAND strings 25 arranged along the X-direction share a bit line BL. The semiconductor memory device 1 includes a plurality of blocks 31. Here, the NAND strings 25 may be arranged in a staggered pattern. For instance, the silicon pillars SP themselves may be arranged in a staggered pattern. Specifically, a plurality of silicon pillars SP are arranged in a row along the Y-direction to constitute a silicon pillar row. There are a plurality of silicon pillar rows. The arrangement pitch of the silicon pillars SP is equal in all the silicon pillar rows. The Y-direction position of the silicon pillars SP may be different between the silicon pillar rows adjacent in the X-direction. In this case, the pipe connector PC connects the silicon pillars SP located at oblique positions, i.e., located in a direction inclined with respect to the X-direction and the Y-direction.

Furthermore, the semiconductor memory device 1 includes a memory unit 32 and a control unit 33. The memory unit 32 is a circuit capable of statically storing prescribed information. The memory unit 32 includes e.g. a ROM fuse. The control unit 33 is a driving circuit for driving the block 31 and the memory unit 32. The control unit 33 outputs a plurality of levels of voltage to the word electrode WL, the select gate electrode SG, the source line SL, the bit line BL, and the back gate electrode BG of the block 31.

Next, a method for driving a semiconductor memory device according to the embodiment is described.

Figure 4:
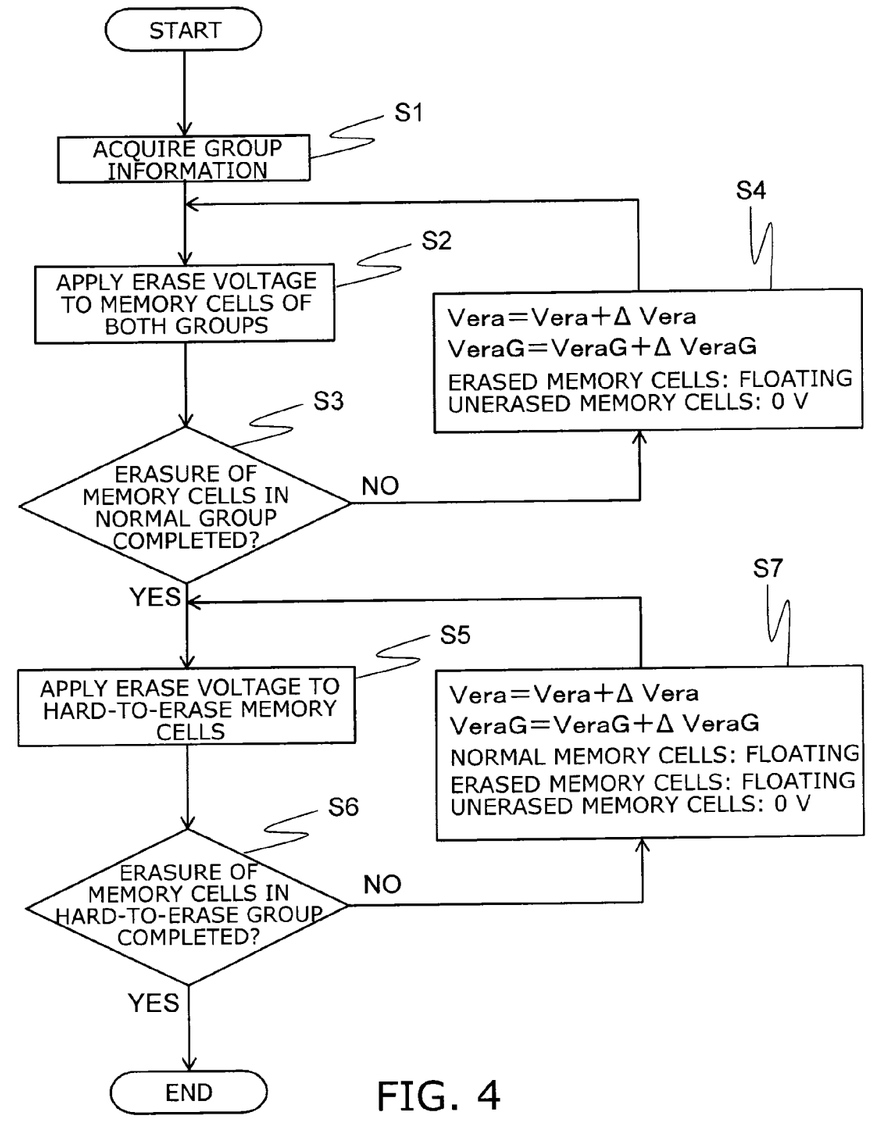
FIG. 4 is a flow chart showing a method for driving the semiconductor memory device according to the first embodiment.

FIG. 4 is a flow chart showing a method for driving a semiconductor memory device according to the embodiment.

Figure 5A:
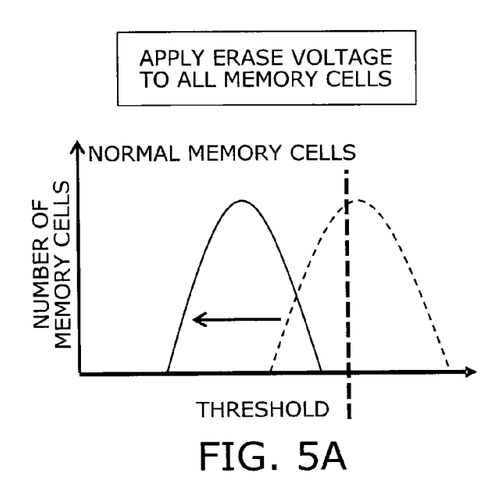
FIGS. 5A to 5D are graphs showing threshold distribution of memory cells, horizontal axes represent the threshold, vertical axes represent the number of memory cells.
Figure 5B:
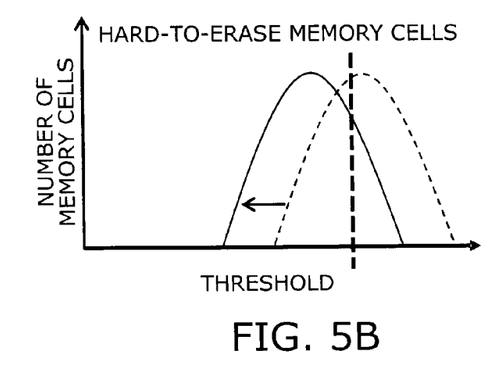
Figure 5C:
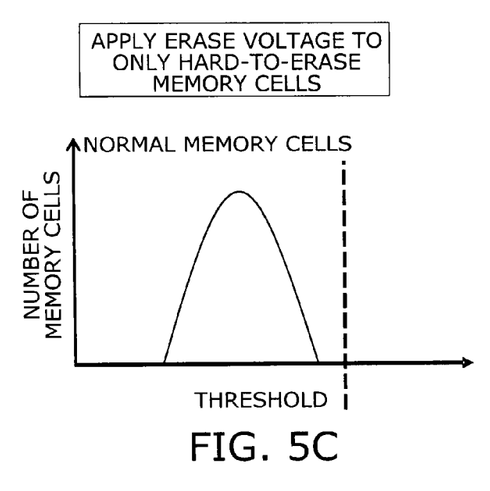
Figure 5D:
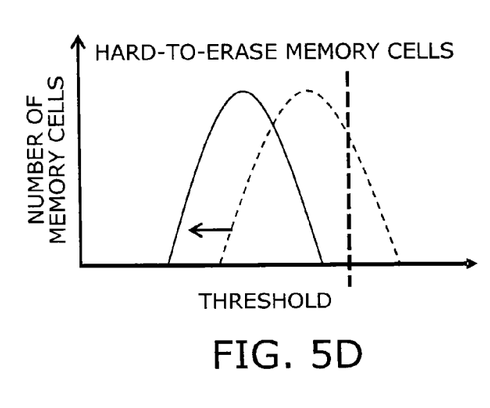

FIGS. 5A to 5D are graphs showing the threshold distribution of memory cells. The horizontal axis represents the threshold. The vertical axis represents the number of memory cells. FIG. 5A shows the threshold distribution change of normal memory cells in the erase operation of all memory cells. FIG. 5B shows the threshold distribution change of hard-to-erase memory cells in the erase operation of all memory cells. FIG. 5C shows the threshold distribution change of normal memory cells in the erase operation of hard-to-erase memory cells. FIG. 5D shows the threshold distribution change of hard-to-erase memory cells in the erase operation of hard-to-erase memory cells.

In the semiconductor memory device 1, when writing data to a memory cell MC, a write voltage is applied between the silicon pillar SP and the word electrode WL. The write voltage is configured so that the potential of the word electrode WL is higher than the potential of the silicon pillar SP. Thus, a tunnel current flows through the tunnel insulating film 21. Accordingly, electrons are injected from the silicon pillar SP into the charge accumulation film 22 and accumulated in the charge accumulation film 22. This results in increasing the threshold of the memory cell MC. Thus, data is written.

When reading data of a memory cell MC, a prescribed read voltage is applied between the silicon pillar SP and the word electrode WL to detect whether a current flows in the silicon pillar SP. Thus, it is determined whether electrons are accumulated in the charge accumulation film 22. Accordingly, the value written in the memory cell MC is read.

Furthermore, when erasing data from a memory cell MC, an erase voltage is applied between the silicon pillar SP and the word electrode WL. The erase voltage is configured so that the potential of the word electrode WL is lower than the potential of the silicon pillar SP. Specifically, as shown in FIG. 3, the bit line BL and the source line SL are applied with a positive erase potential Vera. The select gate electrode SG is applied with a positive gate potential VeraG lower than the erase potential Vera to turn the select transistor ST to the conducting state. Thus, the silicon pillar SP is applied with the erase potential Vera. On the other hand, the word electrode WL is applied with the ground potential (0 V). Thus, for instance, holes are injected from the silicon pillar SP through the tunnel insulating film 21 into the charge accumulation film 22. Accordingly, the charge accumulated in the charge accumulation film 22 is reduced. This results in erasing data from the memory cell MC. In the following, this operation is also referred to as "applying the erase voltage Vera to the memory cell MC". The data erasure is performed block by block. That is, data of all the memory cells MC belonging to the block 31 is erased by a series of erase operations.

However, in an actual device, the erasure characteristic varies between the memory cells MC due to structural factors such as nonuniformity in the diameter of the silicon pillar SP, and nonuniformity in the arrangement of word electrodes WL and the film thickness and film quality of the tunnel insulating film 21. That is, susceptibility to erasure of data is different between the memory cells MC even under application of the same erase voltage. For instance, the silicon pillar SP is often thicker in the upper part due to the constraints of lithography technique. In this case, the silicon pillar SP has a large diameter in the memory cell MC located at the uppermost stage of the multilayer body 14. Thus, the surface of the word electrode WL opposed to the silicon pillar SP has a small curvature. Accordingly, even under application of the prescribed erase voltage, the electric field applied to the tunnel insulating film 21 is weak, and the accumulated charge is reduced less easily. That is, the erasure characteristic is low. Furthermore, in the memory cells MC located at the uppermost stage and the lowermost stage of the multilayer body 14, the adjacent word electrode WL is located only on one Z-direction side. Thus, the assist effect from the neighboring word line WL is insufficient. This also results in low erasure characteristic.

Thus, in the semiconductor memory device 1 according to the embodiment, for instance, at the time of factory shipment, the erasure characteristic of each memory cell MC is evaluated. Depending on the erasure characteristic, the memory cells MC are classified into two groups, i.e., the normal group G1 and the hard-to-erase group G2. In the memory cell MC of the normal group G1, data is erased more easily. In the memory cell MC of the hard-to-erase group G2, data is erased less easily. For instance, the erase operation is performed under the same condition for all the memory cells MC. Subsequently, the threshold of each memory cell MC is evaluated. The memory cell MC with the threshold lowered to less than a reference value is classified in the normal group G1. The memory cell MC with the threshold more than the reference value is classified in the hard-to-erase group G2. Then, group information is stored in the memory unit 32. The group information indicates the group to which each memory cell MC belongs. In the aforementioned example, the memory cells MC located at the uppermost stage and the lowermost stage of the multilayer body 14 are likely to be classified in the hard-to-erase group G2. Furthermore, the control unit 33 refers to the group information stored in the memory unit 32 when performing the erase operation. For the memory cell MC belonging to the hard-to-erase group G2, the control unit 33 performs additional erase processing.

In the following, the erase operation of the embodiment is described in detail.

First, as shown in step S1 of FIG. 4, the control unit 33 receives a command for erasing data of a memory cell MC belonging to a block 31. Then, the control unit 33 accesses the memory unit 32 to acquire the group information. The group information indicates which group of the normal group G1 and the hard-to-erase group G2 each memory cell MC belonging to the block 31 belongs to.

Next, as shown in step S2, an erase voltage Vera is applied to both the memory cells MC belonging to the normal group G1 and the memory cells MC belonging to the hard-to-erase group G2, i.e., all the memory cells MC belonging to the block 31. For instance, the bit line BL and the source line SL are applied with a positive erase potential Vera. The word electrode WL is applied with the ground potential (0 V). The select gate electrode SG is applied with a positive gate potential VeraG lower than the erase potential Vera. Thus, the charge accumulated in the charge accumulation film 22 is reduced. At this time, as shown in FIG. 5A, in the memory cell MC belonging to the normal group G1, the threshold exhibits a relatively large decrease. On the other hand, as shown in FIG. 5B, in the memory cell MC belonging to the hard-to-erase group G2, the amount of decrease of the threshold is relatively small.

Next, as shown in step S3, it is verified whether erasure is completed in all the memory cells MC belonging to the normal group G1 in the block 31. If there is any unerased memory cell MC, i.e., a memory cell MC in which the threshold is not lowered to less than the reference value, then the control proceeds to step S4. Here, in step S3, the threshold of the memory cell MC belonging to the hard-to-erase group G2 is not used as a reference for determining whether to proceed to step S4.

In step S4, the control unit 33 sets the state of the memory cells MC as follows. Of all the memory cells MC belonging to the block 31, in the memory cells MC in which erasure is completed, the word electrode WL is set to the floating state. In the memory cells MC in which erasure is not completed, the word electrode WL is applied with e.g. 0 V. Furthermore, the erase potential Vera and the gate potential VeraG are stepped up. Here, the step-up of the gate potential VeraG may be omitted. Then, returning to step S2, the erase voltage Vera is applied again. Thus, of the memory cells MC belonging to the block 31, the memory cells MC in which erasure is not completed are applied with the erase voltage Vera. Thus, the charge accumulated in the charge accumulation film 22 is reduced. On the other hand, the memory cells MC in which erasure is completed are not applied with the erase voltage Vera.

Thus, the processing loop composed of steps S2-S4 is repeated for all the memory cells MC belonging to the normal group G1 until erasure is completed. Then, in step S3, if erasure is completed for all the memory cells MC belonging to the normal group G1, the control proceeds to step S5.

In step S5, the erase voltage Vera is applied to the memory cells MC belonging to the hard-to-erase group G2. At this time, the memory cells MC belonging to the normal group G1 are prevented from application of the erase voltage Vera by e.g. setting the word electrode WL to the floating state. Thus, as shown in FIG. 5C, there is no substantial change in the threshold in the memory cells MC belonging to the normal group G1. On the other hand, as shown in FIG. 5D, the threshold is lowered in the memory cells MC belonging to the hard-to-erase group G2.

Next, as shown in step S6, it is verified whether erasure is completed in all the memory cells MC belonging to the hard-to-erase group G2. If there is any unerased memory cell MC, then the control proceeds to step S7.

In step S7, the control unit 33 sets the state of the memory cells MC as follows. Of all the memory cells MC belonging to the hard-to-erase group G2, in the memory cells MC in which erasure is completed, the word electrode WL is set to the floating state. In the memory cells MC in which erasure is not completed, the word electrode WL is applied with e.g. 0 V. Furthermore, the erase potential Vera and the gate potential VeraG are stepped up. Here, the step-up of the gate potential VeraG may be omitted. Subsequently, the control returns to step S5. Thus, of the memory cells MC belonging to the hard-to-erase group G2, the memory cells MC in which erasure is not completed are applied again with the erase voltage Vera.

Thus, the processing loop composed of steps S5-S7 is repeated for all the memory cells MC belonging to the hard-to-erase group G2 until erasure is completed. Then, in step S6, if erasure is completed for all the memory cells MC belonging to the hard-to-erase group G2, the erase operation is terminated.

Next, the effect of the embodiment is described.

According to the embodiment, memory cells are previously grouped into normal memory cells and hard-to-erase memory cells. The group information is stored in the memory unit 32. The control unit 33 performs an erase operation on the entire block with reference to the normal memory cells. Then, the control unit 33 performs an additional erase operation on only the hard-to-erase memory cells. Thus, in the hard-to-erase memory cells, the erase operation can be reliably completed. Furthermore, excessive application of the erase voltage to the normal memory cells is avoided. Thus, degradation of each member can be suppressed. As a result, the embodiment can realize a semiconductor memory device and a method for driving the same having high reliability with superiority in the certainty of the operation and the durability of the structure.

Second Embodiment

Next, a second embodiment is described.

The configuration of the semiconductor memory device according to the embodiment is similar to that of the above first embodiment except for the operation of the control unit 33.

In the following, a method for driving a semiconductor memory device according to the embodiment is described.

Figure 6:
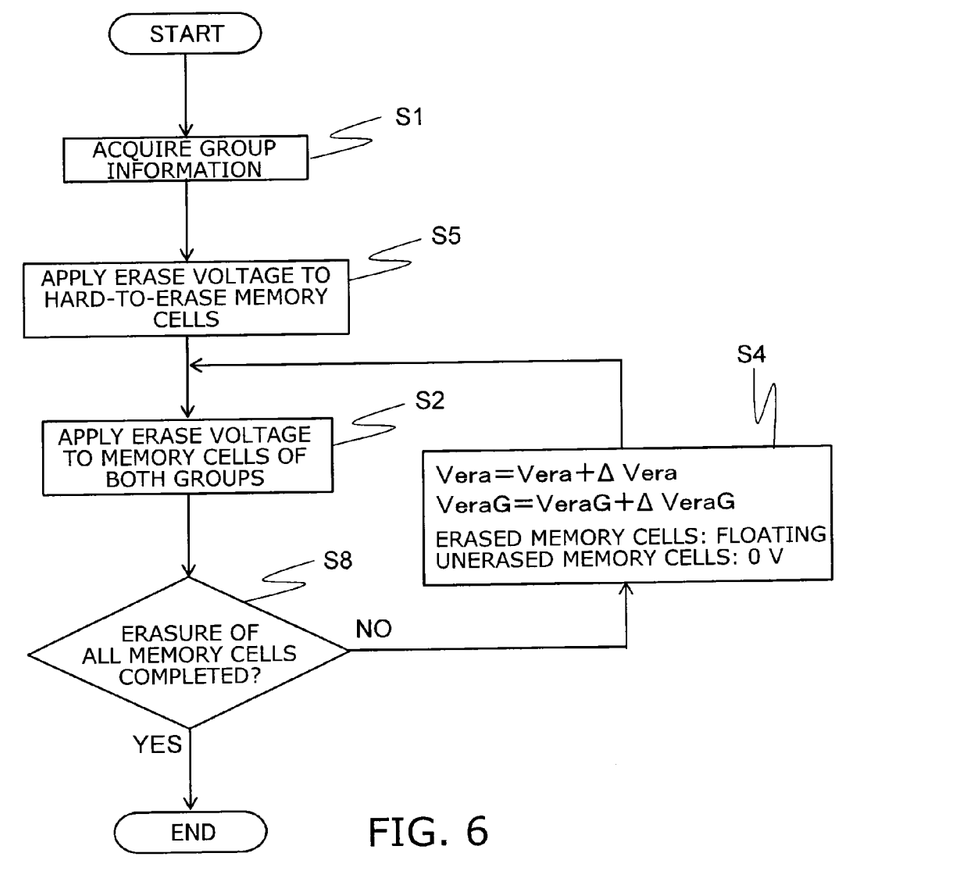
FIG. 6 is a flow chart showing a method for driving a semiconductor memory device according to a second embodiment.

FIG. 6 is a flow chart showing a method for driving a semiconductor memory device according to the embodiment.

Figure 7A:
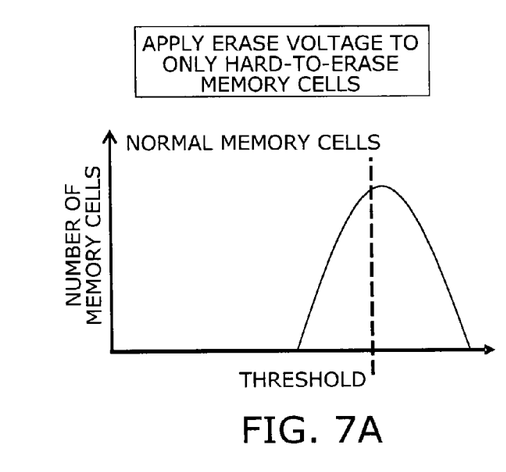
FIGS. 7A to 7D are graphs showing the threshold distribution of memory cells, horizontal axes represent the threshold, vertical axes represent the number of memory cells.
Figure 7B:
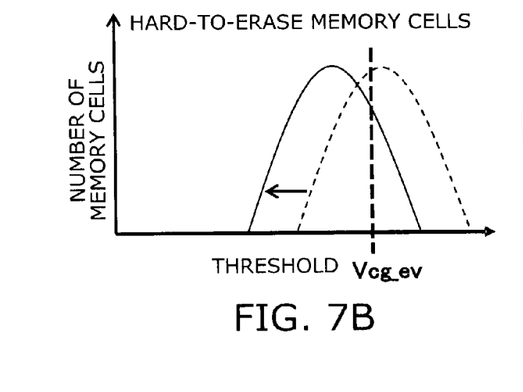
Figure 7C:
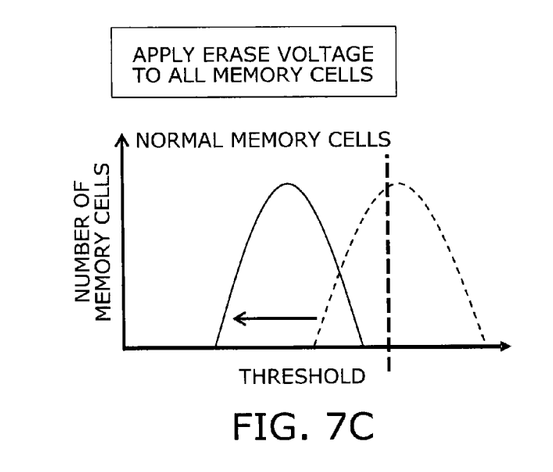
Figure 7D:
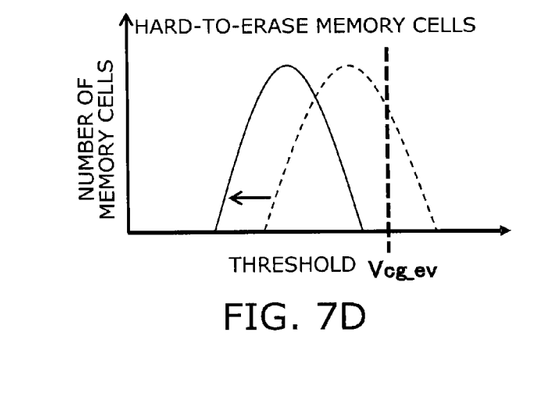

FIGS. 7A to 7D are graphs showing the threshold distribution of memory cells. The horizontal axis represents the threshold. The vertical axis represents the number of memory cells. FIG. 7A shows the threshold distribution change of normal memory cells in the erase operation of hard-to-erase memory cells. FIG. 7B shows the threshold distribution change of hard-to-erase memory cells in the erase operation of hard-to-erase memory cells. FIG. 7C shows the threshold distribution change of normal memory cells in the erase operation of all memory cells. FIG. 7D shows the threshold distribution change of hard-to-erase memory cells in the erase operation of all memory cells.

In FIG. 6, the steps similar to those shown in FIG. 4 are labeled with like reference numerals.

In the embodiment, compared with the above first embodiment, the order of the erase operations is reversed. More specifically, first, the erase voltage is applied to only the memory cells MC belonging to the hard-to-erase group G2. Subsequently, the erase voltage is applied to all the memory cells MC belonging to the block 31.

In the following, the method is specifically described.

First, as shown in step S1 of FIG. 6, the control unit 33 accesses the memory unit 32 to acquire the group information of each memory cell MC.

Next, as shown in step S5, the erase voltage is applied to all the memory cells MC belonging to the hard-to-erase group G2. Thus, as shown in FIG. 7B, the threshold of the memory cell MC belonging to the hard-to-erase group G2 is lowered to some extent. At this time, the threshold of each memory cell MC does not necessarily need to be verified. Furthermore, the threshold of each memory cell MC does not necessarily need to be lowered to less than the threshold. On the other hand, as shown in FIG. 7A, the erase voltage is not applied to the memory cells MC belonging to the normal group G1. Thus, the threshold thereof is not substantially changed.

Next, as shown in step S2, the erase voltage is applied to all the memory cells MC belonging to the block 31, i.e., both the memory cells MC belonging to the normal group G1 and the memory cells MC belonging to the hard-to-erase group G2. Thus, as shown in FIG. 7C, the threshold of the memory cell MC belonging to the normal group G1 is significantly lowered. On the other hand, as shown in FIG. 7D, the amount of decrease of the threshold of the memory cell MC belonging to the hard-to-erase group G2 is smaller than the amount of decrease of the threshold of the normal group G1. However, the threshold of the memory cell MC belonging to the hard-to-erase group G2 has already been lowered to some extent by the erase operation shown in step S5. Consequently, the threshold is lowered to a level comparable to that of the memory cell MC belonging to the normal group G1.

Next, as shown in step S8, it is verified whether erasure is completed in all the memory cells MC belonging to the block 31. If there is any unerased memory cell MC, i.e., a memory cell MC in which the threshold is not lowered to less than the reference value, then the control proceeds to step S4.

In step S4, the control unit 33 sets the state of the memory cells MC as follows. In the memory cells MC in which erasure is completed, the word electrode WL is set to the floating state. In the memory cells MC in which erasure is not completed, the word electrode WL is applied with e.g. 0 V. Furthermore, the erase potential Vera and the gate potential VeraG are stepped up. Here, the step-up of the gate potential VeraG may be omitted. Then, returning to step S2, the erase operation is performed again. Thus, the memory cells MC in which erasure is not completed are applied again with the erase voltage Vera.

Thus, the processing loop composed of steps S2, S8, and S4 is repeated for all the memory cells MC belonging to the block 31 until erasure is completed. Then, in step S8, if erasure is completed for all the memory cells MC, the erase operation is terminated.

Next, the effect of the embodiment is described.

Also in the embodiment, as in the above first embodiment, in the hard-to-erase memory cells, the erase operation can be reliably completed. Furthermore, excessive application of the erase voltage to the normal memory cells is avoided. Thus, degradation of the memory cells can be suppressed.

Furthermore, in the embodiment, after the erase operation for the hard-to-erase group G2 shown in step S5, the erase operation for all the memory cells shown in step S2 is performed. Subsequently, verification is performed in step S8. Thus, there is no need to perform verification immediately after the erase operation shown in step S5. This can accelerate the erase operation. The configuration, driving method, and effect of the embodiment other than the foregoing are similar to those of the above first embodiment.

Here, immediately after the erase operation shown in step S5, verification may be performed, and the erase voltage Vera and the gate voltage VeraG may be stepped up. Thus, for instance, when the erasure characteristic has a large variation in the hard-to-erase group G2, the threshold of the memory cells MC belonging to the hard-to-erase group G2 can be made uniform before the collective erase operation shown in step S2.

In the above first and second embodiments, the semiconductor memory device is U-shaped. More specifically, in the configuration of the example described above, the source line SL and the bit line BL shown in FIG. 1 are both provided above the silicon pillars SP. The lower ends of two silicon pillars SP are connected to each other by the pipe connector PC. However, the configuration is not limited thereto. The semiconductor memory device may be I-shaped. More specifically, the source line SL may be provided below the silicon pillar SP. The upper end of each silicon pillar SP may be connected to the bit line BL. The lower end thereof may be connected to the source line SL.

Third Embodiment

Next, a third embodiment is described.

Figure 8:
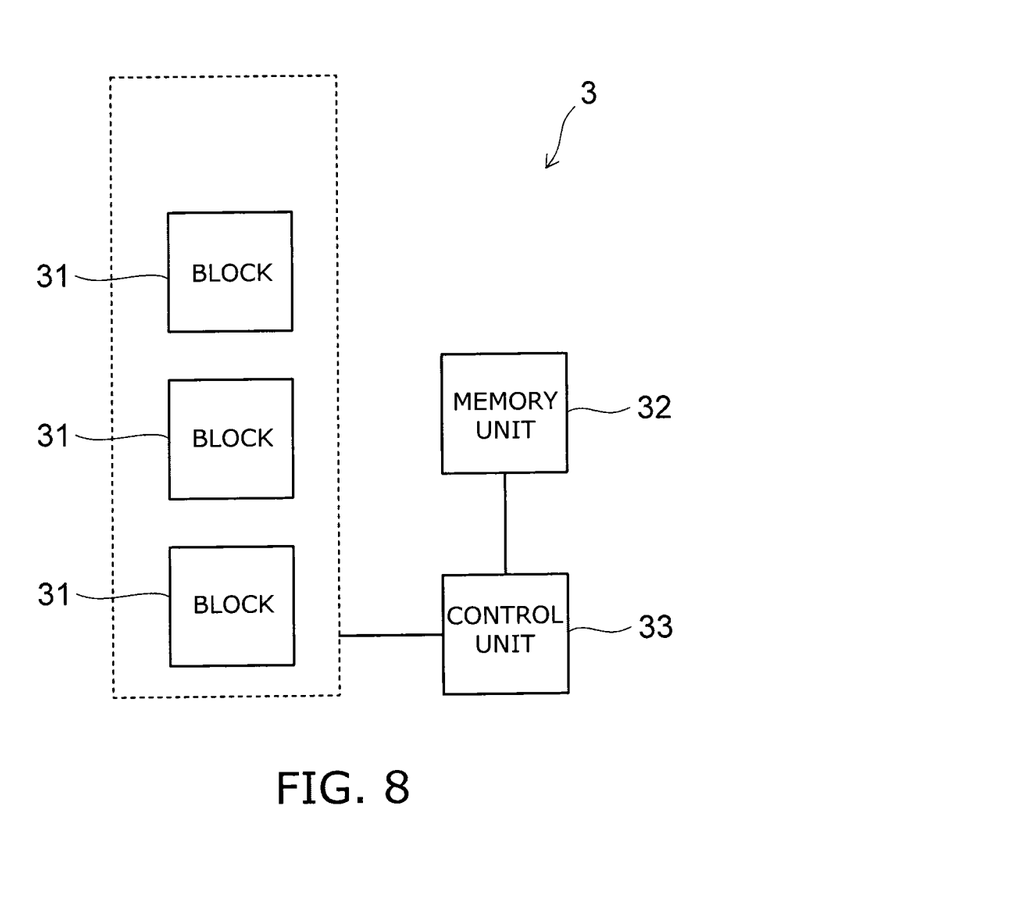
FIG. 8 is a block diagram showing a semiconductor memory device according to a third embodiment.

FIG. 8 is a block diagram showing a semiconductor memory device according to the embodiment.

Figure 9:
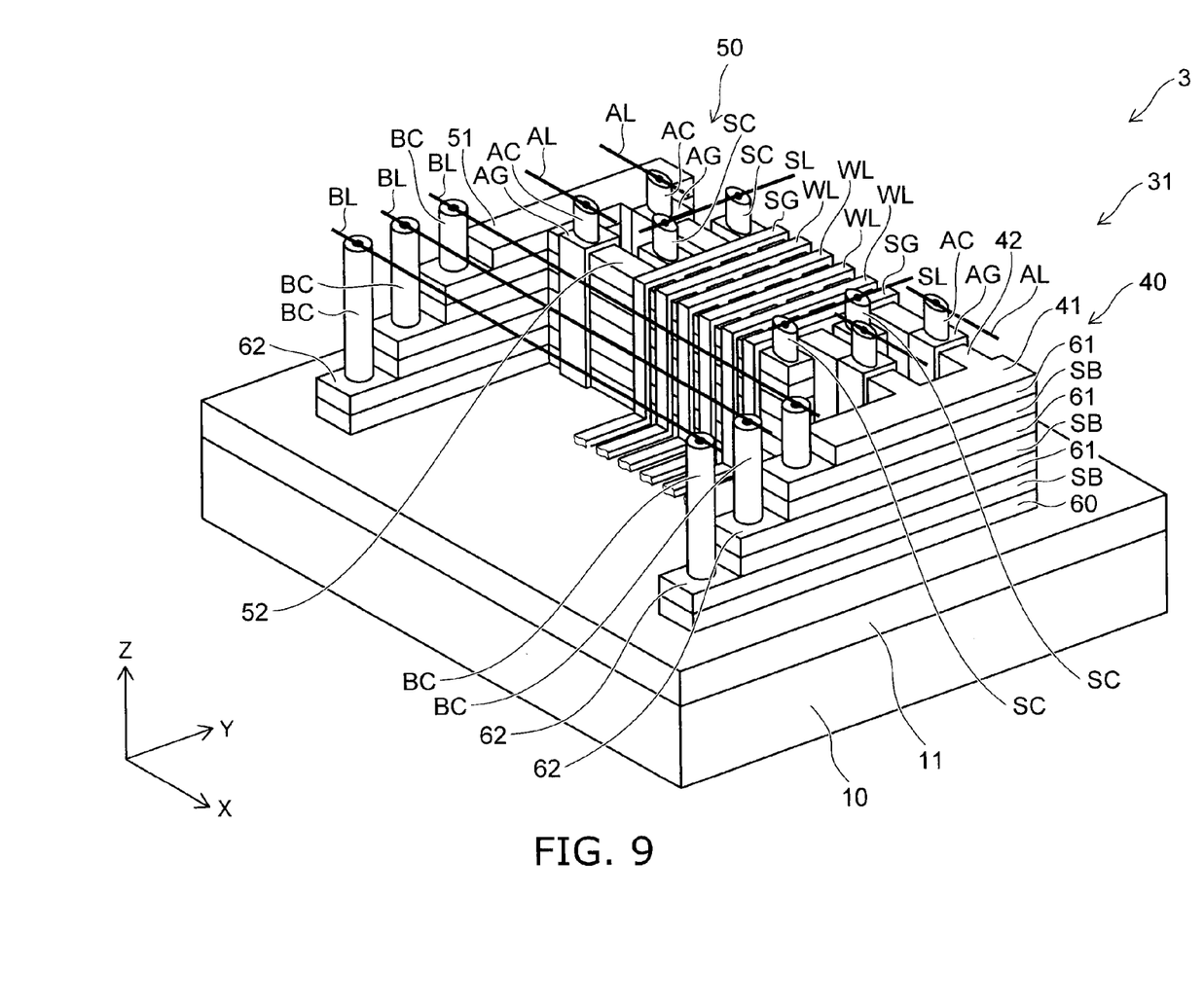
FIG. 9 is a perspective view showing the semiconductor memory device according to the third embodiment.

FIG. 9 is a perspective view showing the semiconductor memory device according to the embodiment.

Figure 10:
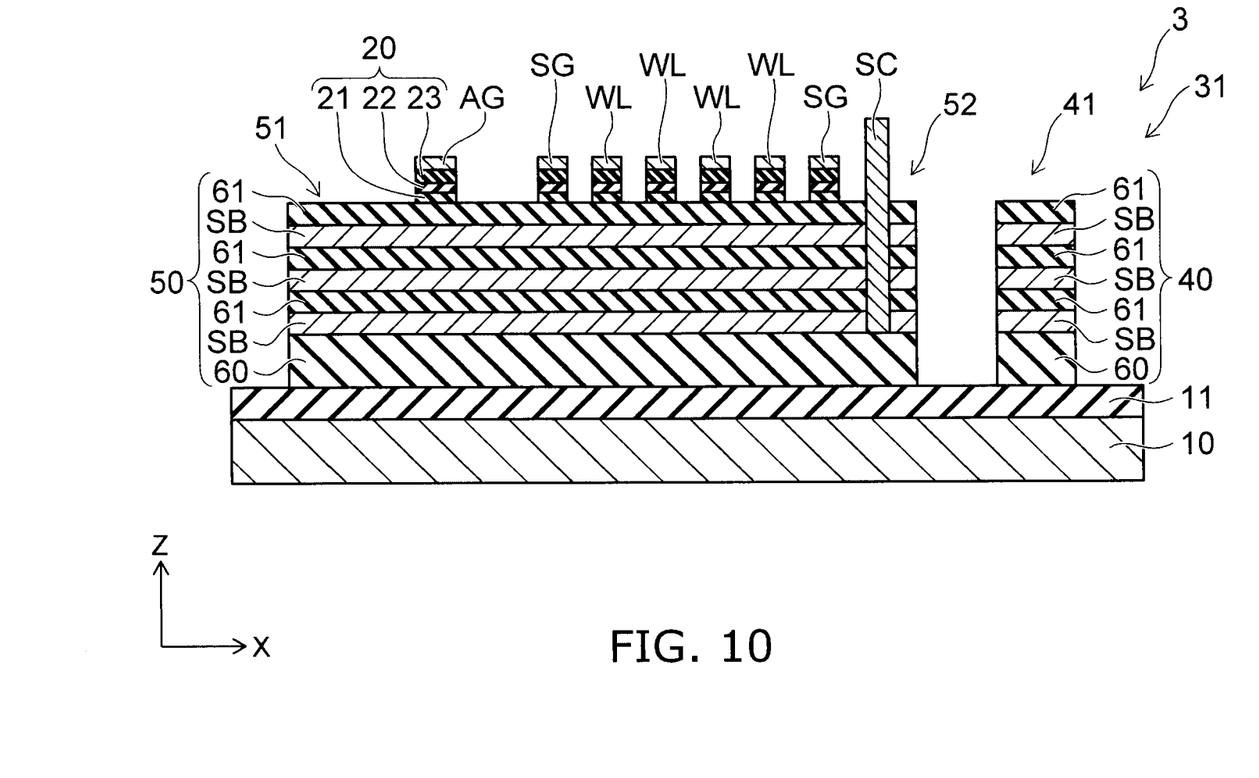
FIG. 10 is a sectional view showing the semiconductor memory device according to the third embodiment.

FIG. 10 is a sectional view showing the semiconductor memory device according to the embodiment.

Figure 11:
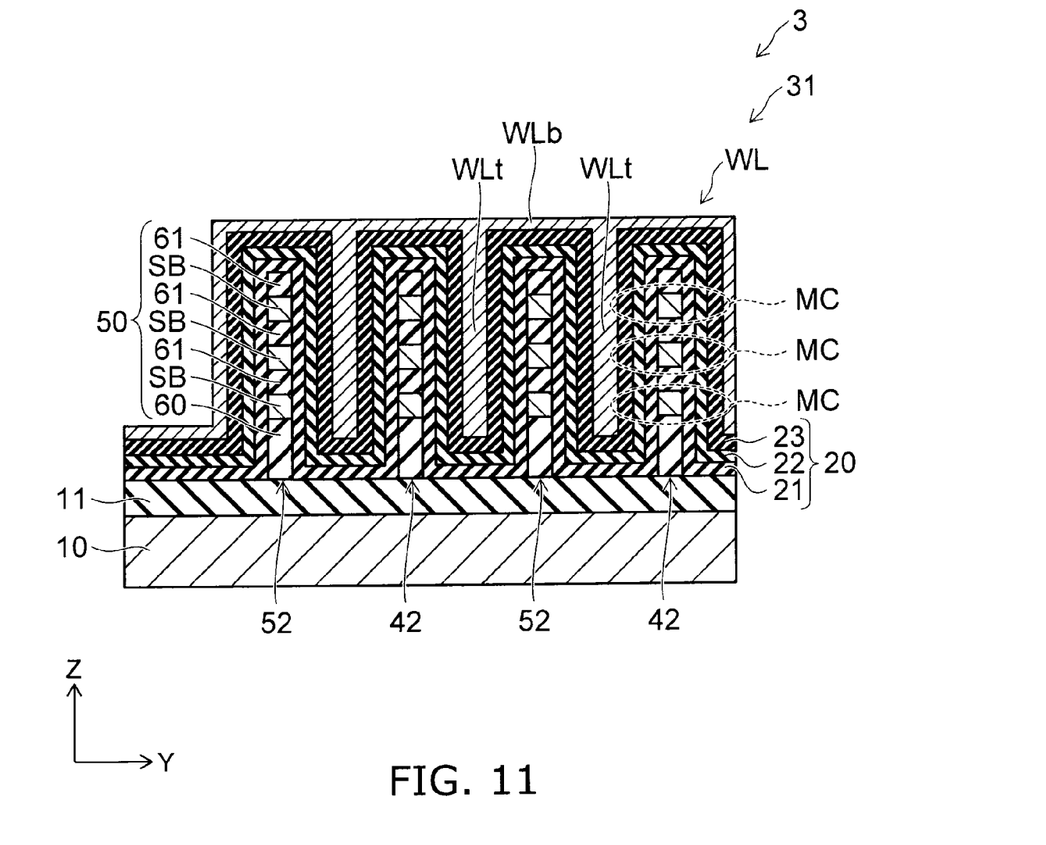
FIG. 11 is a sectional view showing the semiconductor memory device according to the third embodiment.

FIG. 11 is a sectional view showing the semiconductor memory device according to the embodiment.

As shown in FIG. 8, the semiconductor memory device 3 according to the embodiment includes a plurality of blocks 31, one memory unit 32, and one control unit 33. The semiconductor memory device 3 includes a silicon substrate 10 (see FIG. 9). The blocks 31, the memory unit 32, and the control unit 33 are in and above the upper portion of the silicon substrate 10.

As shown in FIGS. 9, 10, and 11, in the block 31, an insulating film 11 is provided on the silicon substrate 10. A pair of multilayer bodies 40 and 50 are provided on the insulating film 11. The multilayer bodies 40 and 50 are shaped like combs as viewed in the Z-direction. The multilayer bodies 40 and 50 are spaced from and mated with each other. More specifically, the multilayer body 40 includes one base part 41 extending in the Y-direction. A plurality of tooth parts 42 extend out in the X-direction from the base part 41. Likewise, the multilayer body 50 includes one base part 51 extending in the Y-direction. A plurality of tooth parts 52 extend out in the X-direction from this base part 51. The base part 41 and the base part 51 are spaced from each other in the X-direction. The tooth part 42 extends out toward the base part 51. The tooth part 52 extends out toward the base part 41. The tooth parts 42 and the tooth parts 52 are alternately arranged along the Y-direction in the region between the base part 41 and the base part 51.

The multilayer bodies 40 and 50 include an interlayer insulating film 60. Silicon beams SB and insulating films 61 are alternately stacked on the interlayer insulating film 60. The silicon beam SB is made of e.g. polysilicon containing impurity. The insulating film 61 is made of e.g. silicon oxide. Thus, in the semiconductor memory device 3 as a whole, a plurality of silicon beams SB extend in the X-direction and are arranged in a matrix along the Y-direction and the Z-direction.

A memory film 20 is provided so as to cover the side surface and the upper surface of the multilayer bodies 40 and 50. In the memory film 20, a tunnel insulating film 21, a charge accumulation film 22, and a block insulating film 23 are stacked in this order from the side of the multilayer bodies 40 and 50. In FIG. 9, the memory film 20 is not shown for convenience of illustration.

A plurality of word electrodes WL are provides astride the multilayer bodies 40 and 50 on the memory film 20. The plurality of word electrodes WL are spaced from each other and arranged along the X-direction. As viewed in the X-direction, the word electrode WL is shaped like a comb. More specifically, the base part WLb of the word electrodes WL extends in the Y-direction above the multilayer bodies 40 and 50. A plurality of tooth parts WLt thereof extend out downward from the base part WLb and penetrate into the region between the tooth part 42 and the tooth part 52. Thus, in the semiconductor memory device 3 as a whole, a plurality of tooth parts WLt extend in the Z-direction and are arranged in a matrix along the X-direction and the Y-direction. A select gate electrode SG is provided astride the tooth parts 42 and 52 on both X-direction sides of the group composed of a plurality of word electrodes WL. The select gate electrode SG has nearly the same shape as the word line WL.

The shape of the portion of the memory film 20 provided between the word electrode WL and the tooth parts 42 and 52 is corrugated as viewed in the X-direction. The tooth parts 42 and 52 are provided inside the portion curved convex upward. The tooth part WLt of the word electrode WL is provided inside the portion curved convex downward. Thus, part of the memory film 20 is provided between the silicon beam SB and the word electrode WL.

A source line contact SC extending in the Z-direction penetrates into the tip part of the tooth parts 42 and 52. The source line contact SC is commonly connected to the silicon beam SB of each stage. The upper end of the source line contact SC is connected to a source line SL extending in the Y-direction. The silicon beam SB of the multilayer body 40 is connected to a common source line SL through the source line contact SC provided for each tooth part 42. The silicon beam SB of the multilayer body 50 is connected to another common source line SL through the source line contact SC provided for each tooth part 52.

On the side surface and the upper surface of the root parts of the tooth parts 42 and 52, an assist gate electrode AG is provided astride these root parts. An assist contact AC is provided directly above the assist gate electrode AG and connected to the assist gate electrode AG. The assist gate electrode AG is provided electrically independently for each tooth part 42 and for each tooth part 52. Each assist gate electrode AG is connected to a different assist gate line AL through the assist contact AC.

One Y-direction end part of the base parts 41 and 51 is processed into a staircase pattern. A step 62 is formed for each silicon beam SB. A bit line contact BC is provided directly above each step 62 and connected to the silicon beam SB of each stage.

In the semiconductor memory device 3 according to the embodiment, a memory cell MC is formed for each crossing portion of the silicon beam SB and the word electrode WL via the memory film 20. As in the above first embodiment, the memory unit 32 stores group information. The group information indicates which group of the normal group G1 and the hard-to-erase group G2 each memory cell MC belongs to. The control unit 33 performs the erase operation shown in FIG. 4 based on the group information stored in the memory unit 32.

The configuration, driving method, and effect of the embodiment other than the foregoing are similar to those of the above first embodiment. Here, the erase operation described in the above second embodiment (see FIG. 6) may be performed in the semiconductor memory device 3 according to the embodiment.

The embodiments described above can realize a semiconductor memory device and a method for driving the same having high reliability.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device comprising:
a plurality of semiconductor members arranged along a first direction and a second direction, the second direction crossing the first direction, and the plurality of semiconductor members extending in a third direction crossing a plane including the first direction and the second direction;
a plurality of electrode members extending in a direction crossing the third direction;
a charge accumulation member provided between the semiconductor member and the electrode member, and the charge accumulation member being capable of accumulating charge;
a memory unit configured to retain information, the information indicating a memory cell belongs to a first group or a second group, the memory cell being formed at each crossing portion of the semiconductor member and the electrode member via the charge accumulation member; and
a control unit configured to perform a first step and a second step when reducing the charge accumulated in the charge accumulation member,
the first step, a first voltage being applied both between the semiconductor member and the electrode member constituting the memory cell belonging to the first group and between the semiconductor member and the electrode member constituting the memory cell belonging to the second group, the first voltage being such that potential of the electrode member is lower than potential of the semiconductor member, and
in the second step, a second voltage being applied between the semiconductor member and the electrode member constituting the memory cell belonging to the second group, the second voltage being such that potential of the electrode member is lower than potential of the semiconductor member.

2. The device according to claim 1, wherein the control unit performs the second step after the first step.

3. The device according to claim 1, wherein the control unit performs the first step after the second step.

4. The device according to claim 1, wherein the charge accumulated in the charge accumulation member is reduced less easily in the memory cell belonging to the second group than in the memory cell belonging to the first group.

5. The device according to claim 1, wherein the control unit sets the electrode member constituting the memory cell belonging to the first group to a floating state in the second step.

6. The device according to claim 1, further comprising:
a substrate,
wherein
an upper surface of the substrate is parallel to the first direction and the second direction, and
the semiconductor member, the electrode member, and the charge accumulation member are provided on the substrate.

7. The device according to claim 1, further comprising:
a substrate,
wherein
an upper surface of the substrate is parallel to the first direction and the third direction, and
the semiconductor member, the electrode member, and the charge accumulation member are provided on the substrate.

8. A semiconductor memory device comprising:
a plurality of semiconductor members arranged along a first direction and a second direction, the second direction crossing the first direction, and the plurality of semiconductor members extending in a third direction crossing a plane including the first direction and the second direction;
a plurality of electrode members extending in a direction crossing the third direction; and
a charge accumulation member provided between the semiconductor member and the electrode member, and the charge accumulation member being capable of accumulating charge,
a memory cell formed at each crossing portion of the semiconductor member and the electrode member via the charge accumulation member belonging to one of a first group and a second group, and
the semiconductor memory device being configured to perform a first step and a second step when reducing the charge accumulated in the charge accumulation member,
in the first step, a first voltage being applied both between the semiconductor member and the electrode member constituting the memory cell belonging to the first group and between the semiconductor member and the electrode member constituting the memory cell belonging to the second group, the first voltage being such that potential of the electrode member is lower than potential of the semiconductor member, and
in the second step, a second voltage being applied between the semiconductor member and the electrode member constituting the memory cell belonging to the second group, the second voltage being such that potential of the electrode member is lower than potential of the semiconductor member.

9. The device according to claim 8, wherein the charge accumulated in the charge accumulation member is reduced less easily in the memory cell belonging to the second group than in the memory cell belonging to the first group.

10. A method for driving a semiconductor memory device, the semiconductor memory device including a plurality of semiconductor members arranged along a first direction and a second direction crossing the first direction and extending in a third direction crossing a plane including the first direction and the second direction, a plurality of electrode members extending in a direction crossing the third direction, and a charge accumulation member provided between the semiconductor member and the electrode member and being capable of accumulating charge, a memory cell being formed at each crossing portion of the semiconductor member and the electrode member via the charge accumulation member, the method comprising:
reducing the charge accumulated in the charge accumulation member, including:
a first step configured to apply a first voltage both between the semiconductor member and the electrode member constituting the memory cell belonging to the first group and between the semiconductor member and the electrode member constituting the memory cell belonging to the second group, the first voltage being such that potential of the electrode member is lower than potential of the semiconductor member; and a second step configured to apply a second voltage between the semiconductor member and the electrode member constituting the memory cell belonging to the second group, the second voltage being such that potential of the electrode member is lower than potential of the semiconductor member.

11. The method according to claim 10, wherein the second step is performed after the first step.

12. The method according to claim 10, wherein the first step is performed after the second step.

13. The method according to claim 10, wherein the charge accumulated in the charge accumulation member is reduced less easily in the memory cell belonging to the second group than in the memory cell belonging to the first group.

14. The method according to claim 10, wherein the electrode member constituting the memory cell belonging to the first group is set to a floating state in the second step.

* * * * *